United States Patent
Tsyganko

(10) Patent No.: US 12,032,522 B2
(45) Date of Patent: Jul. 9, 2024

(54) SYSTEM, METHOD, AND COMPUTER PROGRAM PRODUCT FOR CATALOGING DATA INTEGRITY

(71) Applicant: Paul Tsyganko, Bronx, NY (US)

(72) Inventor: Paul Tsyganko, Bronx, NY (US)

( * ) Notice: Subject to any disclaimer, the term of this patent is extended or adjusted under 35 U.S.C. 154(b) by 34 days.

(21) Appl. No.: 17/648,755

(22) Filed: Jan. 24, 2022

(65) Prior Publication Data

US 2023/0140404 A1 May 4, 2023

Related U.S. Application Data

(60) Provisional application No. 63/263,404, filed on Nov. 2, 2021.

(51) Int. Cl.
*G06F 16/17* (2019.01)
*G06F 16/16* (2019.01)
*H03M 13/09* (2006.01)

(52) U.S. Cl.
CPC ........ *G06F 16/1734* (2019.01); *G06F 16/168* (2019.01); *H03M 13/096* (2013.01)

(58) Field of Classification Search
CPC . G06F 16/1734; G06F 16/168; H03M 13/096
See application file for complete search history.

(56) References Cited

U.S. PATENT DOCUMENTS

| | | | | |
|---|---|---|---|---|
| 7,443,321 B1* | 10/2008 | Kaufman | ............... | H03M 7/30 341/51 |
| 8,028,106 B2* | 9/2011 | Bondurant | ........... | G06F 3/0686 710/68 |
| 8,321,648 B2* | 11/2012 | Condict | ................ | G06F 3/0608 711/170 |
| 8,515,909 B2* | 8/2013 | Anglin | ................ | G06F 11/1453 707/774 |
| 9,483,349 B2* | 11/2016 | Sundaram | ............. | G06F 3/0688 |
| 10,726,015 B1* | 7/2020 | Kejser | ................. | G06F 16/2255 |
| 2007/0124415 A1* | 5/2007 | Lev-Ran | ............... | H04L 51/063 709/217 |
| 2011/0231744 A1* | 9/2011 | King | ................... | G06F 9/30003 714/E11.032 |
| 2015/0067819 A1* | 3/2015 | Shribman | ............. | H04L 67/141 709/218 |
| 2015/0199243 A1* | 7/2015 | Wu | ..................... | G06F 11/1451 707/626 |
| 2016/0378990 A1* | 12/2016 | Goodman | ............. | G06F 21/572 726/19 |
| 2017/0147838 A1* | 5/2017 | Alon | ....................... | G06F 21/64 |
| 2021/0064471 A1* | 3/2021 | Park | .................... | G06F 11/1048 |
| 2022/0179948 A1* | 6/2022 | Prudkovskiy | .......... | G06F 21/54 |

* cited by examiner

*Primary Examiner* — Angelica Ruiz
(74) *Attorney, Agent, or Firm* — Dunlap Bennett & Ludwig, PLLC

(57) ABSTRACT

A method of cataloging data integrity is herein disclosed. In certain embodiments, the method includes performing a checksum check. The checksum check is performed by selecting a file that includes a first checksum result, selecting a checksum type, determining a processor L1, L2, and L3 cache size, storing the cache size in a variable, breaking the file into a plurality of chunks based on the variable, generating a checksum result for each chunk, storing each checksum result in the variable, and combining the checksum results to return a second checksum result.

10 Claims, 4 Drawing Sheets

| VERFICO.IO | SEARCH |

DASHBOARD

ASSETS

REPORTS

ORGANIZATION MANAGEMENT

USERS

ORGANIZATION

BILLING

TUPAC/ ME AGAINST THE WORLD

ME AGAINST THE WORLD
TUPAC-1

INTERNAL DESCRIPTION:

TUPAC-1

EXTERNAL DESCRIPTION:

TUPAC-1

CHECKSUM SCHEDULE:

DAILY

EDIT ASSET    GENERATE BAG   SHARE BAG

GENERATE ASSET | FOLDER VIEW

FILE BROWSER

ACTIONS ∨

| NAME | TYPE | CHECKSUM RESULT |
|---|---|---|
| 10GB.BIN | FILE | OB5529C9D5699016022 |
| SERVACLOUD.PDF | FILE | 771B140A363D1592206 |
| ARTARCHIVISTV3.PDF | FILE | 2EA4C0702F50D655C98 |
| STUFF | FOLDER | |
| FB_IMG_15232253.JPG | FILE | 5A2C2C0F00006DD56CE |

FIG.3

| VERFICO .IO | | SEARCH |
|---|---|---|

DASHBOARD

ASSETS

REPORTS

ORGANIZATION MANAGEMENT

USERS

ORGANIZATION

BILLING

TUPAC/ ME AGAINST THE WORLD

10GB.BIN
FILE

ORIGINAL SHA256 CHECKSUM RESULT:

0B5529C9D56990160223832B

LOCATION:

C:\SERVERDATA\1\1\10GB.BIN

UPLOAD DATE:

FEB. 5, 2021, 6:16PM

RUN CHECKSUM   DOWNLOAD FILE   DELETE FILE

| STATUS | DATE | CHECKSUM RESULT |
|---|---|---|
| PASSED | FEB. 5, 2021, 1:52PM | 0B5529C9D56990160223832B |
| PASSED | FEB. 6, 2021, 12:52PM | 0B5529C9D56990160223832B |
| PASSED | FEB. 7, 2021, 12:52PM | 0B5529C9D56990160223832B |
| PASSED | FEB. 8, 2021, 12:52PM | 0B5529C9D56990160223832B |
| PASSED | FEB. 9, 2021, 12:52PM | 0B5529C9D56990160223832B |

FIG.4

SYSTEM, METHOD, AND COMPUTER PROGRAM PRODUCT FOR CATALOGING DATA INTEGRITY

CROSS-REFERENCE TO RELATED APPLICATION

This application claims the benefit of priority of U.S. provisional application No. 63/263,404, filed Nov. 2, 2021, the contents of which are herein incorporated by reference.

BACKGROUND OF THE INVENTION

The present invention relates to the storage of digital files and, more particularly, to a software system that stores a catalog of digital files and its integrity history through automated checks using industry-standard checksum processes. The present invention addresses problems associated with the long-term conversation of data, validation of its integrity and long-term archival of digital information through computer software. Conventional methods are intended to ensure that the data received is the same data that was sent. However, they fail in a number of ways. For example, they do not function as a long-term data integrity tool. They are also not optimized for large data sets and enterprise-grade solutions. Further, they do not work with multiple files, handle large files, catalog the data's integrity, nor do they provide a readable interface. They also do not provide scheduled routine checks and cataloging of data.

As can be seen, there is a need for a software system that catalogs data integrity, as detailed in the following specification.

SUMMARY OF THE INVENTION

In one aspect of the present invention, a method of cataloging data integrity includes the steps of: performing a checksum check, the performing the checksum check further including the steps of: selecting a file that comprises a first checksum result; selecting a checksum type; determining a processor L1, L2, and L3 cache size, the cache size comprising a value; storing the value in a variable; breaking the file into a plurality of chunks based on the variable; generating a checksum result for each chunk; storing each checksum result in the variable; and combining the checksum results to return a second checksum result.

In another aspect of the present invention, a method of cataloging data integrity includes the steps of: receiving an editable schedule for automatically performing a checksum check that produces a checksum result; selecting a file that comprises a first checksum result; performing the checksum check, wherein the performing the checksum check further includes the steps of: selecting a file that comprises a first checksum result; selecting a checksum type; determining a processor L1, L2, and L3 cache size, the cache size comprising a value; storing the value in a variable; breaking the file into a plurality of chunks based on the variable; generating a checksum result for each chunk; storing each checksum result in the variable; and combining the checksum results to return a second checksum result; comparing the first checksum result and the second checksum result; generating an alert if the second checksum result does not equal the first checksum result; and cataloging the second checksum result in a database if the second checksum result equals the first checksum result.

These and other features, aspects and advantages of the present invention will become better understood with reference to the following drawings, description, and claims.

BRIEF DESCRIPTION OF THE DRAWINGS

The following figures are included to illustrate certain aspects of the present disclosure and should not be viewed as exclusive embodiments. The subject matter disclosed is capable of considerable modifications, alterations, combinations, and equivalents in form and function, without departing from the scope of this disclosure.

FIG. 3 is an exemplary user interface of the embodiment of the present invention, showing a home screen; and FIG. 4 is another exemplary user interface of the embodiment of the present invention, showing an asset screen.

DETAILED DESCRIPTION OF THE INVENTION

With this overview in mind, and turning now to a more detailed discussion in conjunction with the attached figures, the techniques of the present disclosure are illustrated as being implemented in a computing device such as a PC, laptop, tablet, smartphone or other device capable of executing computer-executed instructions stored on a non-transient medium, e.g., memory, such as RAM, ROM, EPROM, flash memory and so on. Thus, the execution of steps in a process flow is by way of computer-execution of such steps, e.g., via a processor configured to retrieve the corresponding instructions from memory and execute them.

The following detailed description is of the best currently contemplated modes of carrying out exemplary embodiments of the present invention. The description is not to be taken in a limiting sense but is made merely for the purpose of illustrating the general principles of the present invention, since the scope of the present invention is best defined by the appended claims.

Broadly, an embodiment of the present invention provides a software system that catalogs data integrity. The systemic software of the present invention may include at least one computer with a user interface. The computer may include at least one processing unit coupled to a form of memory. The computer may include, but is not limited to, a microprocessor, a server, a desktop, and a laptop. The computer includes a program product, including a machine-readable program code for causing, when executed, the computer to perform steps. The program product may include systemic software which may either be loaded onto the computer or accessed by the computer. The systemic software may be accessed by the computer using any form of a graphical user interface. The computer may access the systemic software via the web browser using the internet, extranet, intranet, host server, internet cloud and the like.

The systemic software of the present invention stores and analyzes data of a file or files. The software catalogs the results to ensure the file's integrity has not changed through scheduled routine checks. Previously, the only tools for digital conservation were not intended to be used for data integrity and cataloging. The software and resulting system of the present invention fills that void. This software provides a scheduled and automated data integrity check, which gets cataloged and used to generate reports on a file's data integrity on an enterprise scale. This software is optimized for large files and large data sets but is usable with any number of files or size of data sets.

Referring now to FIGS. 1-4, a software system that catalogs data integrity may include the following. A file or a set of files on a storage device is stored locally (e.g., on a computer) or can be transferred via cable or through a network to another storage device (e.g., another computer, network device, server, or database) that contains the computer program product loaded thereon.

Figure 1:
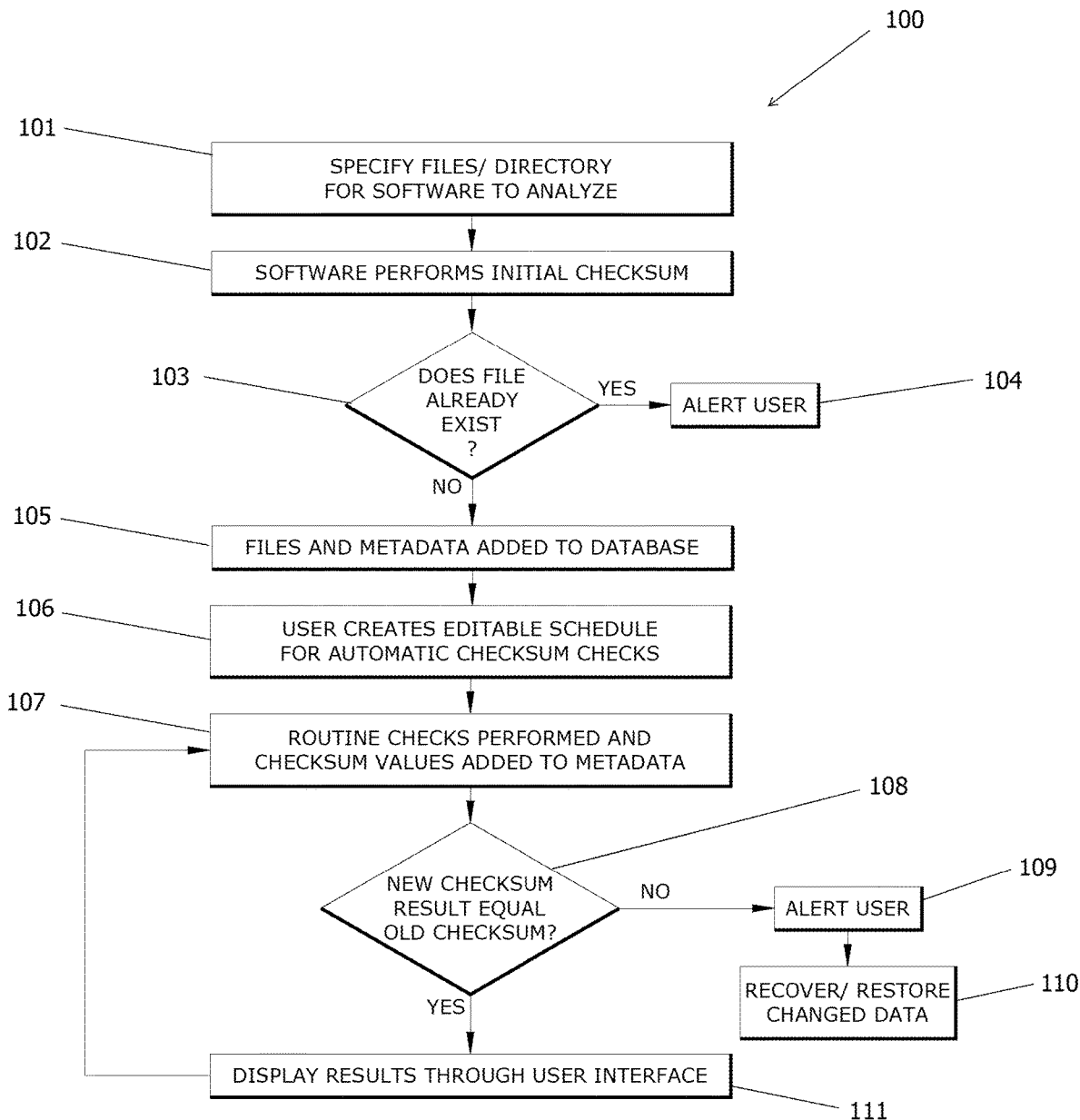
FIG. 1 is a flow chart of an embodiment of the present invention.
Figure 2:
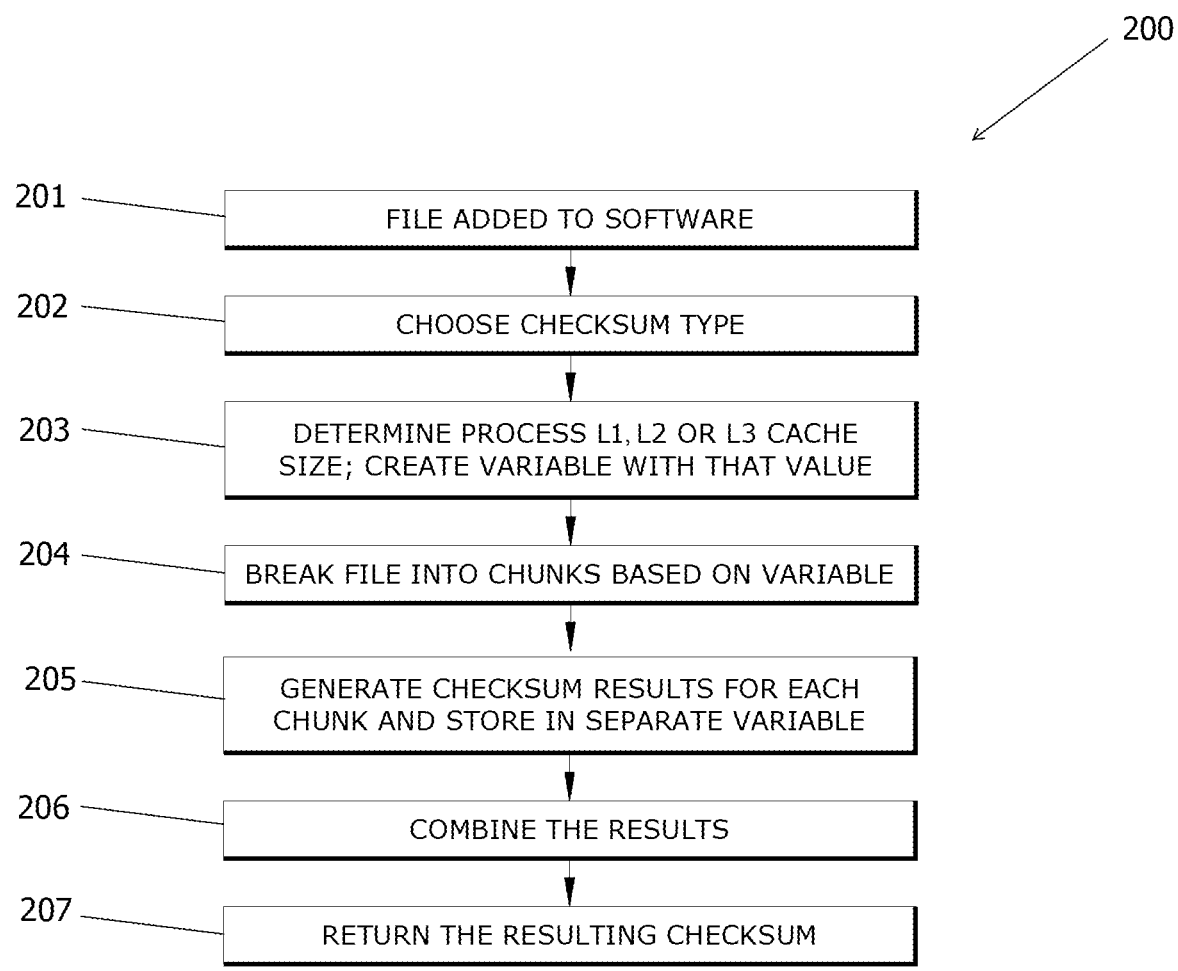
FIG. 2 is a flow chart of a process of the embodiment of the present invention.

In use, and as summarized by the method 100 illustrated in FIG. 1, files and/or a directory are specified for the computer program product of the present invention to analyze (Step 101), and the software system generates the first integrity check (Step 102). The integrity check is a computer file checksum. A checksum, in part, is a result of an algorithm (e.g., a hash function) that generates a string of characters and numbers unique to a set of data. In the context of the present invention, a checksum is a unique identification of a file. Standardized checksums usable in accordance with the present invention include, but aren't limited to, MD5, SHA-1, SHA-256, and SHA-512. This checksum algorithm is generally illustrated in FIG. 2, and is described in greater detail below. Once a file has been uploaded, a subroutine to generate the associated checksum is executed and added to the database as the reference point for further checksums. Meta data is also added to the database at the same time.

Following performance of the first checksum (Step 102), the systemic software determines whether or not a file already exists in the database (Step 103). If the file checksum value matches a record within the database, the systemic software will generate an alert delivered to the user, notifying them of a duplicate file via a chosen interface (Step 104). If the file checksum value does not match a record within the database, that initial checksum result is added to a database (Step 105). A standardized schedule (e.g., daily, weekly, monthly, and the like) is added to the database to perform checksums on that file/set of files (Step 106). A user can manually adjust or add additional schedules to the same file. Once the routine schedule is created (Step 106) in the systemic software (and added to the database), the file or files can be automatically checked (through various checksum algorithms) to verify if any data has been changed (Step 107). The automated checksums are the cataloged history for that specified data sets (Step 107).

All the checksum data is then tied to the associated file. If the new checksum result does not equal the original checksum result for the file (Step 108), the software generates a readable system alert. This system alert can be through many mediums such as an email, through the graphical user interface, and many other graphical mediums (Step 109). If the alert for the existing checksum occurs, the user will have to take action whether to restore the file from a backup or other means. If the file is the original version it will generate the correct result and the error message will disappear (Step 110). If a new file or set of files has the same initial checksum results to an already existing record in the database, the software system generates a readable alert. For larger data sets or files, the software system applies a special subroutine (Steps 203-207), described in greater detail with respect to FIG. 2) to generate checksums more efficiently. The historical data for the file or files is viewable through many interfaces such as computer peripherals, computerized devices, printed mediums to optimize the workflow for data conservation tasks (Step 111).

Referring to FIG. 2, an exemplary method 200 of performing a checksum check for large files is shown. In accordance with the present invention, any step that performs a checksum (e.g., Steps 102 and 107) will use the subroutine/method 200 shown. It permits the present invention to be scalable and applied regardless of file size. As mentioned above, the computer program product/systemic software of the present invention uses standardized methods for long-term sustainability. Once a file has been added to the systemic software (Step 201), a standardized checksum type is selected (Step 202) to generate and validate a file's integrity value. As mentioned above, these standardized checksums may include, but are not limited to, MD5, SHA-1, SHA-256, and SHA-512. If the value has changed, it is no longer the same file. To optimize larger files, the sizes of the chunks can be increased depending on the processor L1, L2, and L3 cache size (Step 203). For larger files, the computer program product is operable to split the file into multiple data chunks (Step 204). The value of the cache size is stored in a variable within the routine. Depending on how large the file is or how many files there are, it can be split into multiple computer cores/threads and processed at a larger scale. Checksum results are then calculated for each chunk, and stored in the separate variable (Step 205). Those separate results are then combined later combined (Step 206), which returns a resulting checksum (Step 207) and produces same result as if it was checked as a whole. This checksum is periodically (e.g., as mentioned above, daily, weekly, monthly, and the like) checked and recorded within the software and database.

Making reference to FIG. 3, what is shown is a file explorer to display a list of files within a directory (which may, in certain embodiments, be a network share, a local storage or other forms of digital storage) and its associated checksums. From the file explorer window a user can select a file which leads to the screen shown in FIG. 4.

As shown in FIG. 4, a single file has been selected within the graphical user interface. The screen of FIG. 4 displays the results of the scheduled checksums throughout the lifespan of the file. If the value of the checksum changed, the file is no longer considered valid and an alert is generated. This can mean the file has been changed or data degradation has occurred.

Various modifications may be made in accordance with the present invention. For example, the scheduling methods may be rearranged before or after ingestion. Other open source-based checksums can be implemented in all the checksum processes. Different methods of performing the checksum, such as ingestion methods, may be used. Other forms of storing checksum changes may be used, such as text file outputs. Further, importing and exporting data in the system may be done in any appropriate manner.

In an exemplary embodiment, the software system that catalogs data integrity may be used as follows. The user will monitor and continuously add files to archive and conserve data as they see fit within their scope. The user will process the files that are required, and the system will automate the process for digital conservation and reporting. The present invention may be written using any appropriate programming language and platform, such that it is able to complete the requisite tasks and provide the user with the useful tools described here above. In standard practice, all elements are important aspects of the present invention. An enterprise hardware environment with higher network capabilities and individual processing nodes can optimize extremely large datasets.

In addition to the above, the present invention includes and results in novel ways of cloud computing, cloud processing, enterprise solutions, data integrity within systems, long-term data archiving, application security, and data validation. The present invention may also be used for data verification from source to destination internally of a system.

The present invention has been described in terms of exemplary embodiments solely for the purpose of illustration. Persons skilled in the art will recognize from this description that the invention is not limited to the embodiments described but may be practiced with modifications and alterations limited only by the spirit and scope of the appended claims.

The computer-based data processing system and method described above is for purposes of example only, and may be implemented in any type of computer system or programming or processing environment, or in a computer program, alone or in conjunction with hardware. The present invention may also be implemented in software stored on a computer-readable medium and executed as a computer program on a general purpose or special purpose computer. For clarity, only those aspects of the system germane to the invention are described, and product details well known in the art are omitted. For the same reason, the computer hardware is not described in further detail. It should thus be understood that the invention is not limited to any specific computer language, program, or computer. It is further contemplated that the present invention may be run on a stand-alone computer system, or may be run from a server computer system that can be accessed by a plurality of client computer systems interconnected over an intranet network, or that is accessible to clients over the Internet. In addition, many embodiments of the present invention have application to a wide range of industries. To the extent the present application discloses a system, the method implemented by that system, as well as software stored on a computer-readable medium and executed as a computer program to perform the method on a general purpose or special purpose computer, are within the scope of the present invention. Further, to the extent the present application discloses a method, a system of apparatuses configured to implement the method are within the scope of the present invention.

While one or more preferred embodiments are disclosed, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims that follow.

While apparatuses and methods are described in terms of "comprising," "containing," or "including" various components or steps, the apparatuses and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted. Moreover, the use of directional terms such as above, below, upper, lower, upward, downward, left, right, and the like are used in relation to the illustrative embodiments as they are depicted in the figures, the upward or upper direction being toward the top of the corresponding figure and the downward or lower direction being toward the bottom of the corresponding figure.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A method of cataloging data integrity within a computer-executed software routine executed using a processing unit coupled to memory, the method comprising the steps of:
    performing a checksum check, the performing the checksum check further comprising the steps of:
        selecting a file that comprises a first checksum result, the file comprising a file size;
        selecting a checksum type;
        determining a processor L1, L2, and L3 cache size, the cache size comprising a value;
        storing in memory the value in a first variable within the software routine;
        breaking the file into a plurality of chunks based on the first variable;
        storing in memory a file size threshold in a second variable;
        generating a checksum result for each chunk, wherein if the file size exceeds the file size threshold stored in the second variable, then said generating step occurs in multiple computer cores/threads;
        storing each checksum result in the first variable; and
        combining the checksum results to return a second checksum result.

2. The method of claim 1, wherein the method further comprises the step of:
    comparing the first checksum result and the second checksum result.

3. The method of claim 2, wherein the method further comprises the step of:
    generating an alert if the second checksum result does not equal the first checksum result.

4. The method of claim 2, wherein the method further comprises the step of:
    cataloging the second checksum result in a database if the second checksum result equals the first checksum result.

5. The method of claim, 1, wherein the checksum type is one of MD5, SHA-1, SHA-256, and SHA-512.

6. A method of cataloging data integrity within a computer-executed software routine executed using a processing unit coupled to memory, the method comprising the steps of:
- receiving an editable schedule for automatically performing a checksum check that produces a checksum result;
- selecting a file that comprises a first checksum result, the file comprising a file size;
- performing the checksum check, wherein the performing the checksum check further comprises the steps of:
  - selecting a file that comprises a first checksum result;
  - selecting a checksum type;
  - determining a processor L1, L2, and L3 cache size, the cache size comprising a value;
  - storing in memory the value in a first variable within the software routine;
  - breaking the file into a plurality of chunks based on the first variable;
  - storing in memory a file size threshold in a second variable;
  - generating a checksum result for each chunk, wherein if the file size exceeds the file size threshold stored in the second variable, then said generating step occurs in multiple computer cores/threads;
  - storing each checksum result in the variable; and
  - combining the checksum results to return a second checksum result;
- comparing the first checksum result and the second checksum result;
- generating an alert if the second checksum result does not equal the first checksum result; and
- cataloging the second checksum result in a database if the second checksum result equals the first checksum result.

7. The method of claim 6, wherein the checksum type is one of MD5, SHA-1, SHA-256, and SHA-512.

8. The method of claim 6, further comprising the step of:
- displaying the second checksum result on a graphical user interface.

9. The method of claim 8, further comprising the step of:
- displaying a history of previous checksum results on the graphical user interface.

10. The method of claim 6, wherein the alert is transmitted via an electronic mail or through a graphical user interface.

* * * * *